United States Patent
Ganger et al.

[11] Patent Number: 5,886,556
[45] Date of Patent: Mar. 23, 1999

[54] LOW POWER SCHMITT TRIGGER

[75] Inventors: Jeffrey Dale Ganger; Kenneth Robert Burch, both of Austin, Tex.

[73] Assignee: Motorola, Inc., Schaumburg, Ill.

[21] Appl. No.: 791,441

[22] Filed: Jan. 27, 1997

[51] Int. Cl.[6] .................................. H03K 3/295
[52] U.S. Cl. .................. 327/206; 327/205; 327/199; 327/73
[58] Field of Search ..................... 327/199, 206, 327/205, 210, 214, 73, 427, 437

[56] References Cited

U.S. PATENT DOCUMENTS

| | | | |
|---|---|---|---|
| 3,984,703 | 10/1976 | Jorgensen | 327/206 |
| 4,369,381 | 1/1983 | Okamoto et al. | 327/206 |
| 4,464,587 | 8/1984 | Suzuki et al. | 327/206 |
| 4,539,489 | 9/1985 | Vaughn | 327/206 |
| 4,563,594 | 1/1986 | Koyama | 327/206 |
| 5,121,014 | 6/1992 | Huang | 327/276 |
| 5,602,496 | 2/1997 | Mahmood | 327/206 |

FOREIGN PATENT DOCUMENTS 362136914  6/1987  Japan ............................ 327/206

*Primary Examiner*—Dinh Le
*Attorney, Agent, or Firm*—Paul J. Polansky

[57] ABSTRACT

A Schmitt trigger (30) operates at low power and low frequency and can be implemented in a small amount of surface area on an integrated circuit. Specifically, the Schmitt trigger (30) includes transistors (34, 40) that are implemented as long channel devices and operate in a linear region for providing resistive elements, and another pair of transistors (44, 46) that function as non-linear devices allowing a current through the Schmitt trigger (30) to provide both a reference and the switchpoints for the Schmitt trigger (30). These transistors also establish low current through the Schmitt trigger (30).

13 Claims, 1 Drawing Sheet

5,886,556

LOW POWER SCHMITT TRIGGER

FIELD OF THE INVENTION

This invention relates generally to electrical circuits, and more particularly to Schmitt triggers.

BACKGROUND OF THE INVENTION

Schmitt triggers are used in various applications for providing hysteresis to a digital input of a circuit. There are various known prior art Schmitt triggers available. FIG. 1 illustrates in schematic diagram form a Schmitt trigger in accordance with the prior art. Schmitt trigger 10 includes inverter 12, P-channel transistors 14 and 22, N-channel transistors 20 and 24, and inverter 26. Inverter 12 includes P-channel transistor 16 and N-channel transistor 18. As in most Schmitt trigger circuits, positive feedback is used to adjust a switchpoint of the inverter 12. The positive feedback includes non-linear elements 22 and 24 coupled to the output of inverter 12 to switch the supply to inverter 12 based on logic swing of an input signal labeled "$V_{IN}$". P-channel transistors 14 and 22 essentially provide a divider circuit. A ratio of P-channel transistor 14 to P-channel transistor 22 determines an upper switchpoint of inverter 12. Likewise, N-channel transistor 20 and 24 form a voltage divider to control the low switching voltage of inverter 12.

A current flows through the voltage divider reference circuits causing Schmitt trigger 10 to consume a relatively large amount of power. Also, the gates of P-channel transistor 14 and N-channel transistor 20 are coupled to receive the input voltage $V_{IN}$ causing increased input capacitance for Schmitt trigger 10.

Power is consumed in Schmitt trigger 10 when the input voltage $V_{IN}$ is less than $V_{DD}$ minus a threshold voltage ("$V_T$") of transistor 14, and greater than $V_{SS}$ plus a $V_T$ of transistor 20. P-channel transistor 14 and N-channel transistor 20 will remain conductive causing a current to flow through the circuit between $V_{DD}$ and $V_{SS}$, thus consuming a large amount of current. In order to reduce the current through P-channel transistor 14 and P-channel transistor 22, the gate length of P-channel transistor 22 can be increased. However, if one increases the gate length of P-channel transistor 22, a gate length of P-channel transistor 16 must also be increased. In addition, the gate length of P-channel transistor 14 would also have to be increased in order to give the same hysteresis point. Increasing the gate lengths of these transistors increases the surface area required for implementing Schmitt trigger 10 on an integrated circuit. In addition to increasing the gate lengths of each of the P-channel transistors, a corresponding increase in gate lengths of each of the N-channel transistors would also be required.

DESCRIPTION OF A PREFERRED EMBODIMENT

Generally, the present invention provides a Schmitt trigger that operates at low power and low frequency which can be implemented in small amount of surface area on an integrated circuit. Specifically, Schmitt trigger 30 includes transistors that are implemented as long channel devices and operate in a linear region for providing resistive elements, and another pair of transistors that function as non-linear devices allowing a current through Schmitt trigger 30 to provide both a reference and the switchpoints for the Schmitt trigger. This also allows for low current through the Schmitt trigger.

Figure 2:
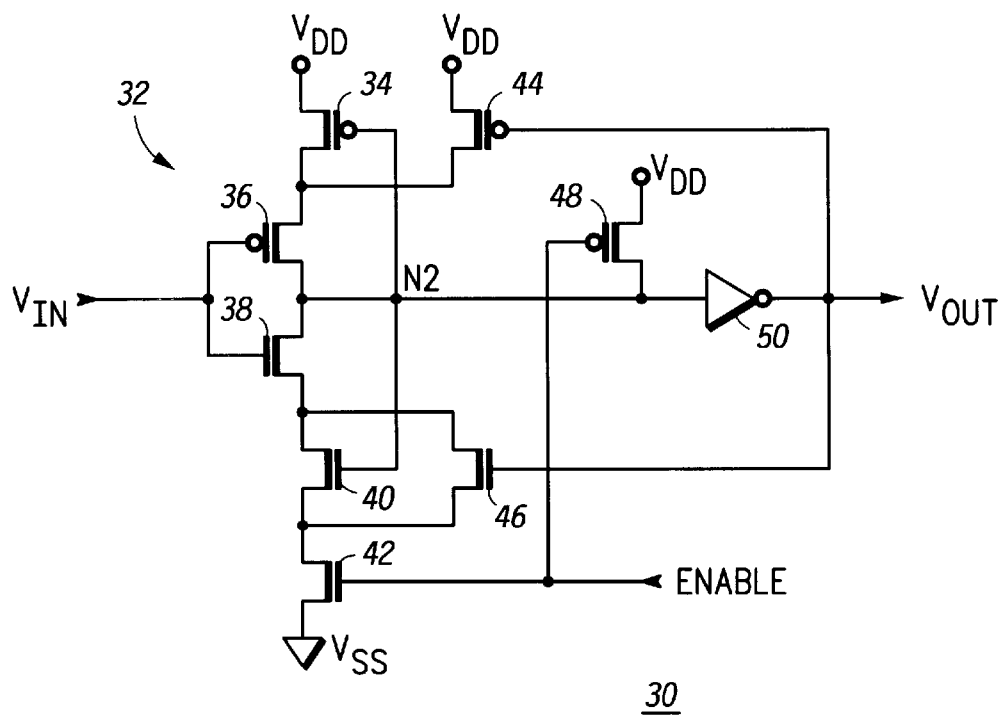
FIG. 2 illustrates in schematic form a CMOS low power Schmitt trigger according to the present invention.

FIG. 2 illustrates in schematic diagram form a Schmitt trigger 30 in accordance with the present invention. Schmitt trigger 30 includes inverter 32; P-channel transistors 34, 44, and 48; N-channel transistors 40, 42, and 46; and inverter 50. Inverter 32 includes P-channel transistor 36 and N-channel transistor 38.

P-channel transistor 34 has a source connected to a power supply voltage terminal labeled "$V_{DD}$", a drain and a gate. P-channel transistor 36 has a source connected to the drain of P-channel transistor 34, a gate for receiving an input voltage labeled "$V_{IN}$", and a drain connected to the gate of P-channel transistor 34 at a node labeled "N2".

N-channel transistor 38 has a drain connected to the drain of P-channel transistor 36, a gate for receiving input voltage $V_{IN}$, and a source. N-channel transistor 40 has a source connected to the drain of N-channel transistor 38, a gate connected to node N2, and a drain. N-channel transistor 42 has a drain connected to the source of N-channel transistor 40, a gate for receiving an enable signal labeled "ENABLE", and a source connected to a power supply voltage terminal labeled "$V_{SS}$".

P-channel transistor 44 has a source connected to $V_{DD}$, a gate, and a drain connected to the source of P-channel transistor 36. N-channel transistor 46 has a drain connected to the source of N-channel transistor 38, a gate, and a source connected to the source of N-channel transistor 40. P-channel transistor 48 has a source connected to $V_{DD}$, a gate connected to the gate of N-channel transistor 42, and a drain connected to node N2. Inverter 50 has an input terminal connected to node N2, and an output terminal for providing an output signal labeled "$V_{OUT}$". The gates of P-channel transistor 44 and N-channel transistor 46 are connected to the output terminal of inverter 50.

In the illustrated embodiment, Schmitt trigger 30 is used to provide hysteresis to an output of an oscillator circuit to eliminate extra clock edges. However, Schmitt trigger 30 can be used in various other applications requiring hysteresis with the additional requirements of low power consumption and lower frequency operation. Input signal $V_{IN}$ is a CMOS logic signal. When $V_{IN}$ is a logic low, node N2 is a logic high causing P-channel transistor 34 to be non-conductive. P-channel transistor 44 will be substantially conductive providing $V_{DD}$ to the source of P-channel transistor 36. N-channel transistor 40 will be substantially conductive, operating in a linear region to provide a predetermined resistance between inverter 32 and $V_{SS}$. Note that N-channel transistor 42 and P-channel transistor 48 are provided to enable and disable Schmitt trigger 30.

When $V_{IN}$ is a logic high, node N2 is low, causing N-channel transistor 40 to be non-conductive. N-channel transistor 46 is conductive, providing $V_{SS}$ or ground to the source of N-channel transistor 38. P-channel transistor 44 will be non-conductive, and P-channel transistor 34 will be conductive and operate in a linear region as a resistive element. Output signal $V_{OUT}$ is thereby provided with a hysteresis transfer function because two different thresholds are provided, a low threshold provided by inverter 32 and P-channel transistor 34, and a high threshold provided by inverter 32 and N-channel transistor 40. P-channel transistor 44 and N-channel transistor 46 provide positive feedback such that when $V_{IN}$ is a low voltage, P-channel transistor 44 is conductive providing $V_{DD}$ to inverter 32. Also when $V_{IN}$ is high, N-channel transistor 46 is conductive, coupling ground to inverter 32. In addition to establishing a voltage reference for inverter 32, P-channel transistor 44 and N-channel transistor 46 function as non-linear elements, providing a switching function for Schmitt trigger 30.

Figure 1:
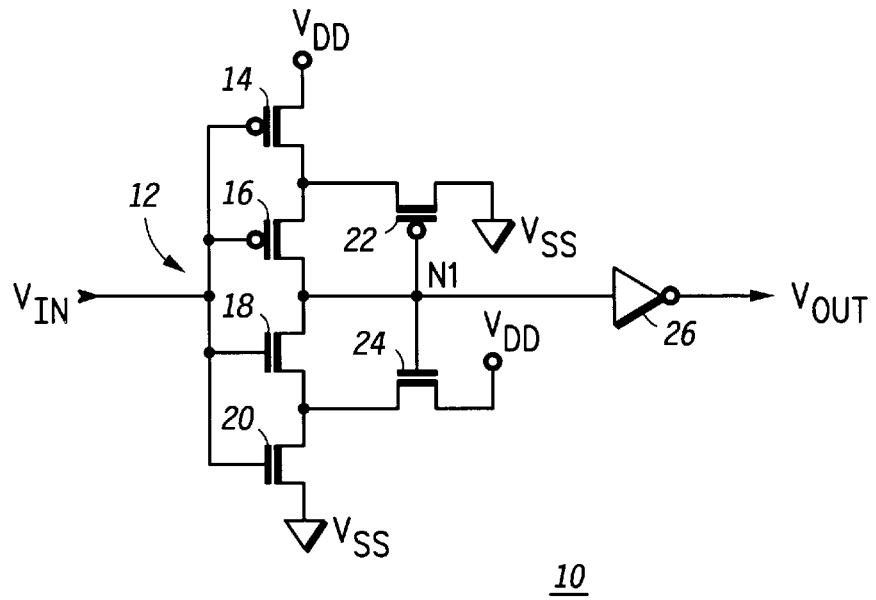
FIG. 1 illustrates in schematic form a known complementary metaloxide-semiconductor (CMOS) Schmitt trigger circuit.

In contrast to Schmitt trigger 10 illustrated in prior art FIG. 1 which has a reference current in addition to a current through inverter 12, Schmitt trigger 30, in accordance with the present invention, provides that the same current which is used to switch inverter 32 is also used to establish a reference voltage for the inverter for the low and high thresholds, or transitions. Since only one current is used for the reference and switching functions in Schmitt trigger 30, Schmitt trigger 30 provides relatively lower power consumption than Schmitt trigger 10. Another advantage of Schmitt trigger 30 is that input capacitance is lower since only inverter 32 receives input signal $V_{IN}$.

In order for Schmitt trigger 10 in FIG. 1 to provide lower power consumption, all of the gate lengths of the transistors in Schmitt trigger 10 must be increased proportionately, thus, increasing the surface area required to implement Schmitt trigger 10. In Schmitt trigger 30, the major power consumption advantage is provided by long channel transistors 34 and 40. Therefore, inverter 32 is not the primary determiner of power consumption in Schmitt trigger 30. Therefore, inverter 32 can be implemented much smaller than inverter 12 in Schmitt trigger 10. In addition, P-channel transistor 44 and N-channel transistor 46 can be formed as a minimum-sized inverter gate for the corresponding process used to implement Schmitt trigger 30 in an integrated circuit. By comparison, P-channel transistor 44 and N-channel transistor 46 are orders of magnitude smaller than corresponding P-channel transistor 22 and N-channel transistor 24 in FIG. 1 for a corresponding amount of power consumption.

Another benefit of Schmitt trigger 30 is that a resistance of P-channel transistor 34 and N-channel transistor 40 along with a capacitive coupling of node N2 provide a low pass filter effect for additional noise immunity. Furthermore, Schmitt trigger 30 provides for low current when Schmitt trigger 30 is operating between $V_{DD}$ and the high threshold voltage, and between $V_{SS}$ and the low threshold voltage. Power consumption and the threshold voltages of Schmitt trigger 30 may be independently controlled.

In other embodiments, Schmitt trigger 30 can be implemented with polysilicon resistors, nitride resistors, well resistors, or other types of resistive elements in place of P-channel transistor 34 and N-channel transistor 40. However, it is preferable to implement Schmitt trigger 30 with transistors operating as resistive elements because they can be fabricated with less area than diffusion or polysilicon resistors. Also, in the illustrated embodiment inverter 50 provides the positive feedback for both P-channel transistor 44 and N-channel transistor 46. However in other embodiments a separate inverter could be used for providing positive feedback for those elements. In addition, in embodiments not requiring the Schmitt trigger to be enabled and disabled, N-channel transistor 42 and P-channel transistor 48 may be removed. Further, Schmitt trigger 30 is illustrated using CMOS technology. However, other technologies such as bipolar, silicon-on-insulator (SOI), and gallium arsenide (GaAs) can be used as well.

While the invention has been described in the context of a preferred embodiment, it will be apparent to those skilled in the art that the present invention may be modified in numerous ways and may assume many embodiments other than that specifically set out and described above. For example, transistors 34 and 40 which form resistive elements may be made variable through various techniques such as programmable by a control bit or bits in a register, a metal option, and the like. Accordingly, it is intended by the appended claims to cover all modifications of the invention which fall within the true spirit and scope of the invention.

What is claimed is:

1. A low power Schmitt trigger comprising:

a first transistor having a first current electrode coupled to a first power supply voltage terminal, a control electrode, and a second current electrode;

a second transistor having a first current electrode coupled to said second current electrode of said first transistor, a control electrode for receiving an input signal, and a second current electrode coupled to said control electrode of said first transistor;

a third transistor having a first current electrode coupled to said second current electrode of said second transistor, a control electrode for receiving said input signal, and a second current electrode;

a fourth transistor having a first current electrode coupled to said second current electrode of said third transistor, a control electrode coupled to said second current electrode of said second transistor, and a second current electrode coupled to a second power supply voltage terminal;

an inverter having an input terminal coupled to said second current electrode of said second transistor, and an output terminal for providing an output signal of the low power Schmitt trigger;

a fifth transistor having a first current electrode coupled to said first power supply voltage terminal, a control electrode coupled to said output terminal of said inverter, and a second current electrode coupled to said second current electrode of said first transistor; and a sixth transistor having a first current electrode coupled to said second current electrode of said third transistor, a control electrode coupled to said output terminal of said inverter, and a second current electrode coupled to said second power supply voltage terminal.

2. The low power Schmitt trigger of claim 1 further comprising a seventh transistor having a first current electrode coupled to said second current electrode of said fourth transistor, a control electrode for receiving an enable signal, and a second current electrode coupled to said second power supply voltage terminal.

3. The low power Schmitt trigger of claim 2 further comprising an eighth transistor having a first current electrode coupled to said first power supply voltage terminal, a control electrode for receiving said enable signal, and a second current electrode coupled to said second current electrode of said second transistor.

4. The low power Schmitt trigger of claim 1 wherein said first, second, and fifth transistors are characterized as being P-channel metal-oxide-semiconductor (MOS) transistors, and wherein said third, fourth, and sixth transistors are characterized as being N-channel MOS transistors.

5. A low power Schmitt trigger comprising:

a P-channel MOS transistor having a first current electrode coupled to a first power supply voltage terminal, a control electrode, and a second current electrode, said P-channel MOS transistor characterized as operating in a linear region when a voltage at said second current electrode of said first transistor is approximately equal to a voltage of a second power supply voltage terminal;

a first transistor having a first current electrode coupled to said second current electrode of said P-channel MOS transistor, a control electrode for receiving an input signal, and a second current electrode coupled to said control electrode of said P-channel MOS transistor;

a second transistor having a first current electrode coupled to said second current electrode of said first transistor, a control electrode for receiving said input signal, and a second current electrode;

a resistive element having a first terminal coupled to said second current electrode of said second transistor, and a second terminal coupled to a second power supply voltage terminal, characterized as conducting a second current proportional to a voltage difference between said first and said second terminals thereof when said input signal has a logic level corresponding to said second power supply voltage terminal;

an inverter having an input terminal coupled to said second current electrode of said first transistor, and an output terminal for providing an output signal of the low power Schmitt trigger;

a third transistor having a first current electrode coupled to said first power supply voltage terminal, a control electrode coupled to said output terminal of said inverter, and a second current electrode coupled to said second terminal of said P-channel MOS transistor; and a fourth transistor having a first current electrode coupled to said second current electrode of said second transistor, a control electrode coupled to said output terminal of said inverter, and a second current electrode coupled to said second power supply voltage terminal.

6. The low power Schmitt trigger of claim 5 wherein said first transistor is characterized as being a P-channel metal-oxide-semiconductor (MOS) transistor, and wherein said second transistor is characterized as being an N-channel MOS transistor.

7. The low power Schmitt trigger of claim 6 wherein said third transistor is characterized as being a P-channel MOS transistor, and wherein said fourth transistor is characterized as being an N-channel MOS transistor.

8. The low power Schmitt trigger of claim 5 wherein said third transistor is characterized as being a P-channel MOS transistor, and wherein said fourth transistor is characterized as being an N-channel MOS transistor.

9. The low power Schmitt trigger (30) of claim 5 wherein said resistive element (40) is characterized as being an N-channel MOS transistor having a first current electrode coupled to said second current electrode of said second transistor, a control electrode coupled to said second current electrode of said first transistor, and a second current electrode coupled to said second power supply voltage terminal, said N-channel MOS transistor characterized as operating in a linear region when a voltage at said second current electrode of said first transistor is approximately equal to a voltage of said first power supply voltage terminal.

10. The low power Schmitt trigger of claim 5 further comprising a fifth transistor having a first current electrode coupled to said second terminal of said resistive element, a control electrode for receiving an enable signal, and a second current electrode coupled to said second power supply voltage terminal.

11. The low power Schmitt trigger of claim 10 further comprising a sixth transistor having a first current electrode coupled to said first power supply voltage terminal, a control electrode for receiving said enable signal, and a second current electrode coupled to said second current electrode of said first transistor.

12. The low power Schmitt trigger of claim 11 wherein said fifth transistor is characterized as being an N-channel MOS transistor, and wherein said sixth transistor is characterized as being a P-channel MOS transistor.

13. A low power Schmitt trigger comprising:

a resistive element having a first terminal coupled to a first power supply voltage terminal, and a second terminal, characterized as conducting a first current proportional to a voltage difference between said first and said second terminals thereof when an input signal has a logic level corresponding to said first power supply voltage terminal;

a first transistor having a first current electrode coupled to said second terminal of said first resistive element, a control electrode for receiving said input signal, and a second current electrode;

a second transistor having a first current electrode coupled to said second current electrode of said first transistor, a control electrode for receiving said input signal, and a second current electrode;

an N-channel MOS transistor having a first current electrode coupled to said second current electrode of said second transistor, a control electrode coupled to said second current electrode of said first transistor, and a second current electrode coupled to a second power supply voltage terminal, said N-channel MOS transistor characterized as operating in a linear region when a voltage at said second current electrode of said first transistor is approximately equal to a voltage of said first power supply voltage terminal, an inverter having an input terminal coupled to said second current electrode of said first transistor, and an output terminal for providing an output signal of the low power Schmitt trigger;

a third transistor having a first current electrode coupled to said first power supply voltage terminal, a control electrode coupled to said output terminal of said inverter, and a second current electrode coupled to said second terminal of said first resistive element; and a fourth transistor having a first current electrode coupled to said second current electrode of said second transistor, a control electrode coupled to said output terminal of said inverter, and a second current electrode coupled to said second power supply voltage terminal.

* * * * *